United States Patent
Park et al.

(10) Patent No.: US 9,941,418 B2
(45) Date of Patent: Apr. 10, 2018

(54) SCHOTTKY DIODE HAVING A VARIED WIDTH STRUCTURE

(71) Applicant: Electronics and Telecommunications Research Institute, Daejeon (KR)

(72) Inventors: Jeong Woo Park, Daejeon (KR); Kyung Hyun Park, Daejeon (KR); Hyun Sung Ko, Seoul (KR)

(73) Assignee: Electronics and Telecommunications Research Institute, Daejeon (KR)

(*) Notice: Subject to any disclaimer, the term of this patent is extended or adjusted under 35 U.S.C. 154(b) by 0 days.

(21) Appl. No.: 15/341,448

(22) Filed: Nov. 2, 2016

(65) Prior Publication Data
US 2017/0256656 A1 Sep. 7, 2017

(30) Foreign Application Priority Data
Mar. 2, 2016 (KR) .................. 10-2016-0025264

(51) Int. Cl.
*H01L 29/87* (2006.01)
*H01L 29/20* (2006.01)
*H01L 29/66* (2006.01)
*H01L 23/66* (2006.01)
*H01L 51/05* (2006.01)
*H01L 29/872* (2006.01)
*H01L 21/02* (2006.01)
(Continued)

(52) U.S. Cl.
CPC ...... *H01L 29/872* (2013.01); *H01L 21/02543* (2013.01); *H01L 21/02546* (2013.01); *H01L 21/30612* (2013.01); *H01L 23/66* (2013.01); *H01L 29/205* (2013.01); *H01L 29/66143* (2013.01); *H01L 29/66212* (2013.01); *H01L 51/0579* (2013.01); *H01L 2223/6677* (2013.01)

(58) Field of Classification Search
CPC .............. H01L 29/872; H01L 29/205; H01L 29/66143; H01L 23/66; H01L 29/66212; H01L 51/0579
See application file for complete search history.

(56) References Cited

U.S. PATENT DOCUMENTS 4,989,050 A * 1/1991 Gaw .................. H01L 33/0025
257/13
5,661,077 A   8/1997 Oh et al.
(Continued)

FOREIGN PATENT DOCUMENTS

| EP | 2693498 A2 * | 2/2014 | .......... H01L 33/007 |
|----|-------|---|---|
| KR | 1020000038204 A | 7/2000 | |
| KR | 1020010058252 A | 7/2001 | |

OTHER PUBLICATIONS

Haruo Yamagishi et al., "Au/TaN/Wn/GaAs Structure Schottky Gate Formation for Self-Aligned GaAs MESFET", Japanese Journal of Applied Physics, Oct. 1985, pp. 841-844, vol. 24, No. 10.

*Primary Examiner* — Ida M Soward
(74) *Attorney, Agent, or Firm* — William Park & Associates Ltd.

(57) ABSTRACT

Provided herein is a Schottky diode including: a first semiconductor layer; an intermediate layer provided over the first semiconductor layer; a second semiconductor layer provided over the intermediate layer; an anode provided over the second semiconductor layer; and a cathode provided over the first semiconductor layer, wherein in a sectional view, a width of the second semiconductor layer is greater than a width of the intermediate layer.

8 Claims, 4 Drawing Sheets

(51) Int. Cl.
*H01L 21/306* (2006.01)
*H01L 29/205* (2006.01)

(56) References Cited

U.S. PATENT DOCUMENTS

| | | | | |
|---|---|---|---|---|
| 5,805,627 | A * | 9/1998 | Kubota | H01S 5/2231 359/341.3 |
| 6,043,519 | A * | 3/2000 | Shealy | H01L 21/8252 257/192 |
| 7,116,854 | B2 * | 10/2006 | Kaneko | B82Y 20/00 385/14 |
| 7,148,557 | B2 * | 12/2006 | Yanagihara | H01L 29/0817 257/198 |
| 7,230,276 | B2 * | 6/2007 | Song | H01L 33/145 257/79 |
| 7,638,856 | B2 * | 12/2009 | Nam | B82Y 20/00 257/552 |
| 8,299,558 | B2 | 10/2012 | Botula et al. | |
| 8,319,229 | B2 * | 11/2012 | Yamamoto et al. | H01L 27/15 257/80 |
| 8,637,886 | B2 * | 1/2014 | Tsuji | H01L 33/405 257/100 |
| 8,766,295 | B2 * | 7/2014 | Kim | H01L 25/0756 257/103 |
| 2008/0121868 | A1 | 5/2008 | Jang et al. | |
| 2013/0032856 | A1 * | 2/2013 | Takahashi | H01L 29/267 257/183 |
| 2014/0110729 | A1 * | 4/2014 | Seo | H01L 27/156 257/88 |
| 2014/0124799 | A1 * | 5/2014 | Youn | H01L 33/08 257/88 |
| 2015/0091042 | A1 * | 4/2015 | Kim | H01L 24/14 257/99 |
| 2015/0155426 | A1 * | 6/2015 | Jeon | H01L 33/46 438/29 |
| 2015/0200334 | A1 * | 7/2015 | Chae | H01L 33/22 257/98 |
| 2017/0309787 | A1 * | 10/2017 | Huang | H01L 33/62 |

* cited by examiner

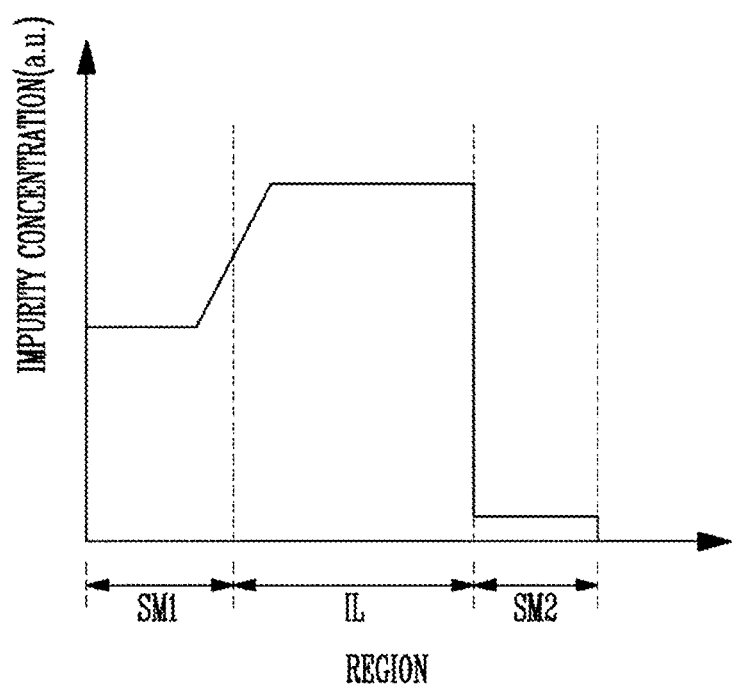

SCHOTTKY DIODE HAVING A VARIED WIDTH STRUCTURE

CROSS-REFERENCE TO RELATED APPLICATION

The present application claims priority to Korean patent application number 10-2016-0025264 filed on Mar. 2, 2016 the entire disclosure of which is incorporated herein in its entirety by reference in its entirety.

BACKGROUND

Field of Invention

Various embodiments of the present disclosure relate to a Schottky diode and a manufacturing method of the same, and more particularly, to a Schottky diode employing an ohmic contact resistance reduction structure and a manufacturing method of the same.

Description of Related Art

A Schottky diode is a diode which uses rectification action of a Schottky barrier formed on a contact surface between a metal and a semiconductor. Such a Schottky diode is used in various elements.

Current flowing through the Schottky diode is represented as an exponential function of a voltage applied thereto, and has characteristics similar to that of a semiconductor p-n junction diode. The Schottky diode is suitable for high-speed operation since a current control function thereof is performed in the majority carrier action. Thus, the Schottky diode is used in a microwave receiving mixer, a fast logic diode, etc.

In the case of conventional Schottky diodes, a metal forming a Schottky junction with a semiconductor, and a cathode metal are separately deposited. Therefore, there is the distance between the two metals, whereby there is a limit in reducing series resistance.

SUMMARY

Various embodiments of the present disclosure are directed to a Schottky diode which is reduced in series resistance.

Furthermore, various embodiments of the present disclosure are directed to a method of manufacturing the Schottky diode.

One embodiment of the present disclosure provides a Schottky diode including: a first semiconductor layer; an intermediate layer provided over the first semiconductor layer; a second semiconductor layer provided over the intermediate layer; an anode provided over the second semiconductor layer; and a cathode provided over the first semiconductor layer, wherein in a sectional view, a width of the second semiconductor layer is greater than a width of the intermediate layer.

The cathode may comprise cathode parts spaced apart from each other by a first distance with the intermediate layer provided therebetween, and the width of the second semiconductor layer may be the same as the first distance.

Each of the first semiconductor layer and the intermediate layer may include a semiconductor material doped with an impurity. The closer to the intermediate layer, the higher an impurity concentration of the first semiconductor layer may be. An impurity concentration of the second semiconductor layer may be lower than the impurity concentration of the first semiconductor layer or an impurity concentration of the intermediate layer.

The second semiconductor layer may include at least one of indium gallium arsenide (InGaAs) and gallium arsenide (GaAs). The intermediate layer may include at least one of indium phosphide (InP), InGaAsP, indium aluminum arsenide (InAlAs), and aluminum gallium arsenide (AlGaAs).

The intermediate layer and the second semiconductor layer may respectively include materials having different etching rates.

The Schottky diode may be used in various elements. In an embodiment of the present disclosure the Schottky diode may be used in an electromagnetic wave sensor. In this case, the electromagnetic wave sensor may further include an antenna coupled to the Schottky diode.

Another embodiment of the present disclosure provides a method of manufacturing a Schottky diode, including: sequentially forming a first semiconductor layer, an intermediate layer and a second semiconductor layer over a substrate; etching the intermediate layer and the second semiconductor layer and forming an undercut in the intermediate layer; and forming a cathode and an anode over the first semiconductor layer and the second semiconductor layer, respectively.

The intermediate layer and the second semiconductor layer may respectively include materials having different etching rates. The intermediate layer and the second semiconductor layer may be selectively etched by a dry etching method, a wet etching method, or a combination of the dry etching method and the wet etching method.

The cathode and the anode may be formed through a single process. The cathode and the anode may be formed by depositing a metal over the first semiconductor layer and the second semiconductor layer and are spaced apart from each other by the undercut. In a sectional view, a width of the second semiconductor layer may be greater than a width of the intermediate layer.

The intermediate layer may be formed of a semiconductor material including an impurity. The impurity may be an n-type impurity.

The second semiconductor layer may include at least one of indium gallium arsenide (InGaAs) and gallium arsenide (GaAs). The intermediate layer may include at least one of indium phosphide (InP), InGaAsP, indium aluminum arsenide (InAlAs), and aluminum gallium arsenide (AlGaAs).

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 3 is a graph conceptually showing an impurity doping concentration of each region in the Schottky diode in accordance with the embodiment of the present disclosure.

DETAILED DESCRIPTION

Figure 1:
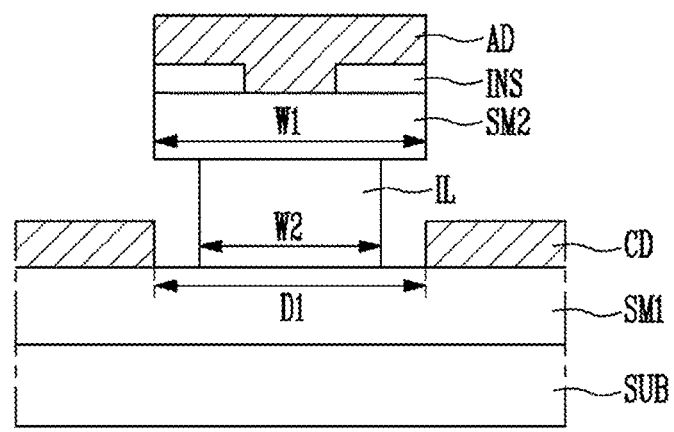
FIG. 1 is a sectional view illustrating a Schottky diode in accordance with an embodiment of the present disclosure.

Reference will not be made in detail to various embodiments of the present disclosure, specific examples of which are illustrated in the accompanying drawings and described below, since the embodiments of the present disclosure may be variously modified in many different forms. However, this is not intended to limit the present disclosure to particular modes of practice, and it is to be appreciated that all changes, equivalents, and substitutes that do not depart from the spirit and technical scope of the present disclosure are encompassed in the present disclosure.

Throughout the disclosure, like reference numerals refer to like parts throughout the various figures and embodiments of the present disclosure. The sizes of elements in the accompanying drawings may be exaggerated for clarity of illustration. It will be understood that, although the terms "first", "second", etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element. In the present disclosure, the singular forms are intended to include the plural forms as well, unless the context clearly indicates otherwise.

It will be further understood that the terms "comprise", "include", "have", etc. when used in this specification, specify the presence of stated features, integers, steps, operations, elements, components, and/or combinations of them but do not preclude the presence or addition of one or more other features, integers, steps, operations, elements, components, and/or combinations thereof. Furthermore, when a first part such as a layer, a film, a region, or a plate is disposed on a second part, the first part may be not only directly on the second part but a third part may intervene between them. In addition, when it is expressed that a first part such as a layer, a film, a region, or a plate is formed on a second part, the surface of the second part on which the first part is formed is not limited to an upper surface of the second part but may include other surfaces such as a side surface or a lower surface of the second part. To the contrary, when a first part such as a layer, a film, a region, or a plate is under a second part, the first part may be not only directly under the second part but a third part may intervene between them.

Embodiments of the present disclosure will hereinafter be described in detail with reference to the accompanying drawings.

FIG. 1 is a sectional view illustrating a Schottky diode in accordance with an embodiment of the present disclosure.

Referring to FIG. 1, the Schottky diode in accordance with the embodiment of the present disclosure includes a substrate SUB, a first semiconductor layer SM1 which is provided on the substrate SUB, an intermediate layer IL which is provided on the first semiconductor layer SM1, a second semiconductor layer SM2 which is provided on the intermediate layer IL, an insulating layer INS which is provided on the second semiconductor layer SM2, an anode AD which comes into contact with the second semiconductor layer SM2, and a cathode CD which is provided on the first semiconductor layer SM1.

The substrate SUB may include silicon, silicon carbide (SiC), sapphire, diamond, and so forth. However, the material of the substrate SUB is not limited to this, and it may include gallium nitride (GaN), indium phosphide (InP), etc.

The first semiconductor layer SM1 is provided on the substrate SUB.

The first semiconductor layer SM1 includes a semiconductor material doped with impurities and corresponds to a cathode layer.

The semiconductor material included in the first semiconductor layer SM1 may be at least one of indium gallium arsenide (InGaAs) and gallium arsenide (GaAs). However, the semiconductor material included in the first semiconductor layer SM1 is not limited to this, and, for example, it may include GaN. The impurities doped on the semiconductor material included in the first semiconductor layer SM1 may be n-type impurities.

Although not shown, an additional buffer layer (not shown) may be provided between the first semiconductor layer SM1 and the substrate SUB. The buffer layer may be provided to match a lattice constant between the first semiconductor layer SM1 and the substrate SUB.

The intermediate layer IL with a predetermined width is provided on the first semiconductor layer SM1. The intermediate layer IL is provided to form an undercut when the Schottky diode is manufactured and simultaneously provide a sufficient amount of impurities on the first semiconductor layer SM1.

The intermediate layer includes a semiconductor material doped with impurities. The semiconductor material included in the intermediate layer IL differs from that included in the first semiconductor layer. For example, the semiconductor material included in the intermediate layer IL may include at least one of InP, InGaAsP, indium aluminum arsenide (InAlAs), and aluminum gallium arsenide (AlGaAs). However, the semiconductor material included in the intermediate layer IL is not limited to this, and GaN, Si, Ge (germanium), SiGe, AlGaN, InGaN, GaAs, etc. may be used.

The impurities may be n-type impurities and be the same as the impurities used in the first semiconductor layer SM1.

The second semiconductor layer SM2 is provided on the intermediate layer IL. The second semiconductor layer SM2 is spaced apart from the first semiconductor layer SM1 with the intermediate layer IL provided therebetween.

The second semiconductor layer SM2 corresponds to an anode layer.

The second semiconductor layer SM2 includes a doped or undoped semiconductor material. In the case where the second semiconductor layer SM2 is doped, the concentration of impurities is markedly lower than that of the first semiconductor layer SM1.

The semiconductor material included in the second semiconductor layer SM2 may be at least one of InGaAs and GaAs. However, the semiconductor material included in the second semiconductor layer SM2 is not limited to this, and, for example, it may include GaN. In an embodiment of the present disclosure, the material included in the second semiconductor layer SM2 may be the same material as that included in the first semiconductor layer SM1. In an embodiment of the present disclosure, the first and/or second semiconductor layer SM1 and/or SM2 may be formed of InGaAs, and the intermediate layer IL may be formed of InP, InGaAsP or InAlAs. In another embodiment of the present disclosure, the first and/or second semiconductor layer SM1 and/or SM2 may be formed of GaAs, and the intermediate layer IL may be formed of AlGaAs.

Referring to a sectional view, the second semiconductor layer SM2 has a width greater than that of the intermediate layer IL. When the width of the second semiconductor layer SM2 is a first width W1 and the width of the intermediate layer IL is a second width W2, the first width W1 is greater than the second width W2. The difference between the first width W1 and the second width W2 is caused by formation of an undercut during a manufacturing process, and this will be described in detail later herein.

The insulating layer INS may be provided on the second semiconductor layer SM2. The insulating layer INS has an opening allowing an anode AD, which will be explained later herein, to come into contact with the second semiconductor layer SM2. In other words, the insulating layer INS may be formed on portion of an upper surface of the second semiconductor layer SM2. For example, although not shown, the insulating layer INS may be formed along the perimeter of the second semiconductor layer SM2.

The insulating layer INS may be formed of an inorganic insulating material or organic insulating material, but it is not limited to this. In an embodiment of the present disclosure, the inorganic insulating material may include at least one of SiNx, SiONx, SiOx, AlN, and Al2O3. The organic insulating material may include polyimide, benzocyclobutane, and so on.

The anode AD is provided on the second semiconductor layer SM2. The anode AD makes contact with the second semiconductor layer SM2 through the opening of the insulating layer INS. The anode AD and the second semiconductor layer SM2 form a Schottky junction.

The anode AD has the same width as that of the second semiconductor layer SM2. Referring to a plan view, the anode AD has the same shape and size as those of the second conductor layer SM2.

The anode AD includes a conductive material. The conductive material may include various metals, alloys of them, etc. In an embodiment of the present disclosure, the metals may include copper, silver, gold, platinum, palladium, nickel, tin, aluminum, cobalt, rhodium, iridium, iron, ruthenium, osmium, manganese, molybdenum, tungsten, niobium, tantalum, titanium, bismuth, antimony, lead, etc. An alloy of at least two metals may be used. The anode AD may be provided in a single layer, but it is not limited to this. The anode AD may be provided in multiple layers. For example, the anode AD may be formed of a combination of layers including Ti/Al/Au or Ti/Al/Ni/Au, or another combination of layers.

Referring to a sectional view, cathodes CD are provided on the first semiconductor layer SM1 on opposite sides of the anode AD. In detail, the cathodes CD are provided on opposite sides of a stack structure including the intermediate layer IL, the second semiconductor layer SM2 and the anode AD. The cathodes CD are spaced apart from each other by a first distance D1. The first distance D1 has the same value as the first width W1, that is, the width of the second semiconductor layer SM2 or the anode AD. The intermediate layer IL is disposed in a space defined between the cathodes CD spaced apart from each other. The intermediate layer IL is also spaced apart from each cathode CD by a predetermined distance. The distance between the intermediate layer IL and each cathode CD may be changed depending on a difference between the first distance D1 and the second width W2. Because the second width W2 is less than the first distance D1, spacing the intermediate layer IL apart from the cathodes CD may be facilitated. In an embodiment of the present disclosure, referring to a plan view, the perimeter of the anode AD and at least portion of the perimeter of the cathode CD may substantially overlap with each other.

In the Schottky diode having the above-mentioned configuration, the distance between the anode AD and the cathode CD is comparatively short despite the structure in which the anode AD and the cathode CD are separated from each other. Therefore, a semiconductor resistance between the anode AD and the cathode CD may be reduced. If the semiconductor resistance is reduced, a series resistance between the anode AD and the cathode CD is reduced and the characteristics of the Schottky diode are also enhanced.

The Schottky diode having the above-mentioned configuration may be manufactured by successively forming the first semiconductor layer SM1, the intermediate layer IL and the second semiconductor layer SM2 on the substrate SUB, etching the intermediate layer IL and the second semiconductor layer SM2 and forming the undercut in the intermediate layer IL, and forming the cathode CD and the anode AD on the first semiconductor layer SM1 and the second semiconductor layer SM2.

Hereinafter, a method of manufacturing the Schottky diode in accordance with an embodiment of the present disclosure will be described with reference to the attached drawings.

FIGS. 2a to 2g are sectional views sequentially illustrating the method of manufacturing the Schottky diode in accordance with the embodiment of the present disclosure.

Figure 2A:
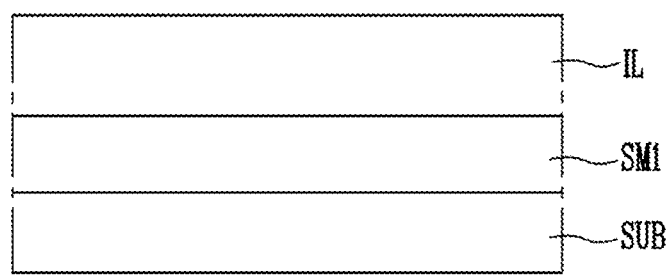
FIGS. 2A to 2G are sectional views sequentially illustrating a method of manufacturing the Schottky diode in accordance with the embodiment of the present disclosure.

Referring to FIG. 2a, the first semiconductor layer SM1 and the intermediate layer IL are successively stacked on the substrate SUB.

The first semiconductor layer SM1 may be formed on the substrate SUB by various methods using a material for forming the first semiconductor layer SM1.

The material for forming the first semiconductor layer SM1 may be a semiconductor material including impurities. For example, the material may be at least one of InGaAs and GaAs. However, the material for forming the first semiconductor layer SM1 is not limited to this. The impurities to be doped on the semiconductor material included in the first semiconductor layer SM1 may be n-type impurities.

In an embodiment of the present disclosure, the first semiconductor layer SM1 may be formed by epitaxially growing the first semiconductor layer SM1 on the substrate SUB through a metal organic chemical vapor deposition (MOCVD) process, but it is not limited to this.

The intermediate layer IL is formed on the first semiconductor layer SM1 using a material different from that of the first semiconductor layer SM1. The intermediate layer IL may be formed by various methods. In an embodiment of the present disclosure, the intermediate layer IL may be formed through an MOCVD process, but it is not limited to this.

The intermediate layer IL is doped with impurities. The impurities may be n-type impurities. The semiconductor material used to form the intermediate layer IL may be selected among materials that can be doped with impurities at a higher impurity concentration, compared to that of the semiconductor material used to form the first semiconductor layer SM1. In the case where the intermediate layer IL is stacked on the first semiconductor layer SM1, the impurities in the intermediate layer IL are diffused from the intermediate layer IL toward the first semiconductor layer SM1. Thereby, the impurity concentration in the first semiconductor layer SM1 is increased, compared to that when the first semiconductor layer SM1 is formed.

Furthermore, the material of the intermediate layer IL may be selected among materials having etching rates different from that of the second semiconductor layer SM2. A material having an etching rate higher than that of the second semiconductor layer SM2 may be selected as the material of the intermediate layer IL.

The diffusion of impurities may be more active when the process of forming the intermediate layer IL is performed under higher temperature conditions. In an embodiment of the present disclosure, the first semiconductor layer SM1 and the intermediate layer IL may be formed through an MOCVD process. Since the MOCVD process can be performed at high temperatures of approximately 600° C. or more, impurities can be easily diffused into the first semiconductor layer SM1.

In an embodiment of the present disclosure, if a sufficient amount of impurities is not diffused from the intermediate layer IL into the first semiconductor layer SM1, an additional heat treatment process may be performed.

The intermediate layer IL may include a semiconductor material different from that of the first semiconductor layer SM1, for example, at least one of InP, InGaAsP, InAlAs, and AlGaAs. However, the semiconductor material included in the intermediate layer IL is not limited to this, and GaN, Si, Ge, SiGe, AlGaN, InGaN, GaAs, etc. may be used.

Figure 2B:
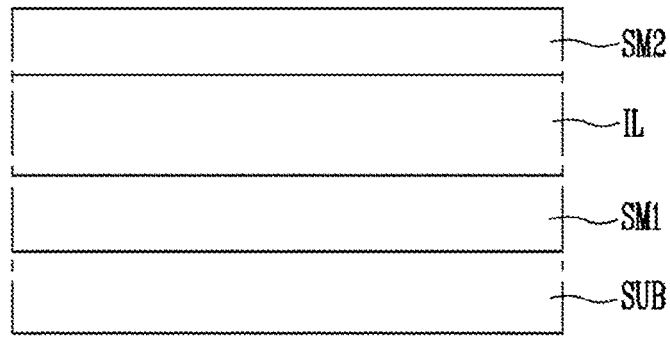

Referring to FIG. 2b, the second semiconductor layer SM2 is formed on the intermediate layer IL. The second semiconductor SM2 is formed on the intermediate layer IL using a material different from that of the intermediate layer IL. The material used to form the second semiconductor layer SM2 may be substantially the same as that of the first semiconductor layer SM1. In an embodiment of the present disclosure, the second semiconductor layer SM2 may be doped or not doped. In the case where the second semiconductor layer SM2 is doped with impurities, the impurity concentration of the semiconductor layer SM2 may be markedly lower than that of the first semiconductor layer SM1.

The second semiconductor layer SM2 may be formed by various methods. In an embodiment of the present disclosure, the second semiconductor layer SM2 may be formed through an MOCVD process, but it is not limited to this. Even when the second semiconductor layer SM2 is formed, diffusion of impurities from the intermediate layer IL to the first semiconductor layer SM1 is also caused, so that the impurity concentration of the first semiconductor layer SM1 is increased. As a result, due to the addition of impurities by the diffusion, the impurity concentration of the first semiconductor layer SM1 may be higher than the maximum impurity concentration that can be obtained through the MOCVD process. For example, in the case where the first semiconductor layer SM1 and the second semiconductor layer SM2 are formed of InGaAs and the intermediate layer IL is formed of InP, an n-type impurity doping concentration of InGaAs which is formed through the typical MOCVD is approximately $10^{18}$ cm$^{-13}$ due to Si. However, an n-type impurity doping concentration of Inp is formed to approximately $4 \times 10^{18}$ cm$^{-13}$ due to Si, and is markedly higher than the n-type impurity doping concentration of InGaAs.

Therefore, when impurities are diffused from the intermediate layer IL to the first semiconductor layer SM1, the impurities with a doping concentration higher than approximately $10^{18}$ cm$^{-13}$ that is the maximum doping concentration of InGaAs may be easily supplied from the intermediate layer IL into the first semiconductor layer SM1.

When the second semiconductor layer SM2 is deposited, diffusion of impurities from the intermediate layer IL into the second semiconductor layer SM2 may be caused, but the degree thereof is markedly less than that of the diffusion of impurities into the first semiconductor layer SM1. Therefore, the impurity concentration of the second semiconductor layer SM2 is markedly lower than the impurity concentration of the first semiconductor layer SM1 or the intermediate layer IL.

Figure 2C:
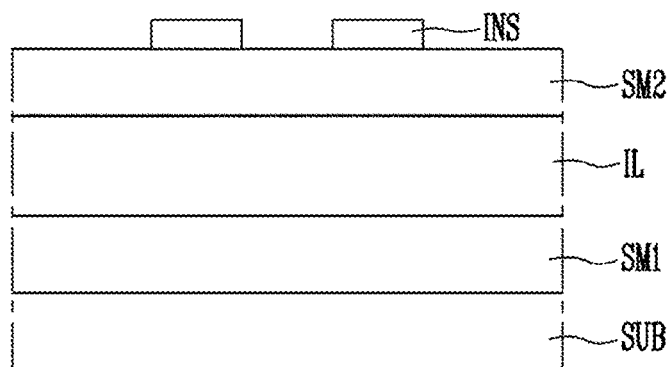

Referring to FIG. 2c, the insulating layer INS is formed on the second semiconductor layer SM2.

The insulating layer INS is formed on the second semiconductor layer SM2 in a region corresponding to a region in which the anode AD is to be formed. The insulating layer INS has an opening allowing the anode AD to come into direct contact with the second semiconductor layer SM2.

The insulating layer INS may be manufactured by various methods, and the method of manufacturing the insulating layer INS is not limited to a certain method. In an embodiment of the present disclosure, the insulating layer INS may be formed by photolithography. In the case where the insulating layer INS is formed by the photolithography, the insulating layer INS may be formed by stacking insulating material and photoresist on the entirety of the surface of the second semiconductor layer SM2, exposing and developing the photoresist, masking the remaining photoresist, and patterning the insulating material.

The insulating layer INS may be formed by depositing inorganic insulating material or organic insulating material, but it is not limited to this. In an embodiment of the present disclosure, the inorganic insulating material may include at least one among SiNx, SiONx, SiOx, AlN and Al2O3. The organic insulating material may include polyimide, benzocyclobutane, and so on.

Figure 2D:
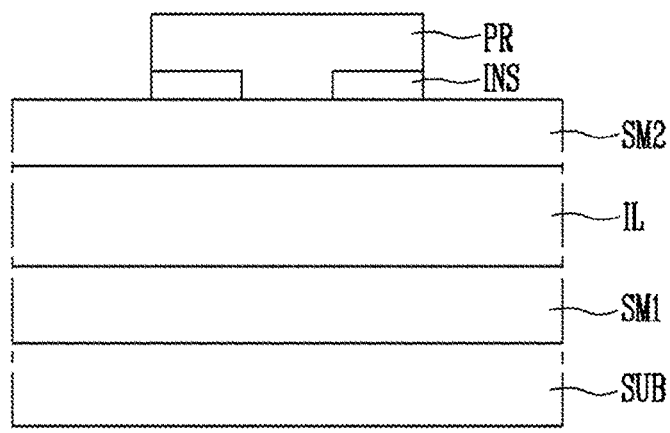

Referring to FIG. 2d, a photoresist layer PR is formed on the second semiconductor layer SM2 formed with the insulating layer INS thereon.

The photoresist layer PR is formed on the region corresponding to the region in which the anode AD is to be formed. The photoresist layer PR is used as a mask when the second semiconductor layer SM2 and the intermediate layer IL are etched later. In an embodiment of the present disclosure, the photoresist layer PR may be formed such that the peripheral edge of the photoresist layer PR corresponds to the peripheral edge of the insulating layer INS. The photoresist layer PR may be provided in the anode forming region by applying photoresist to the entirety of the surface of the second semiconductor layer SM2 formed with the insulating layer INS and then patterning it through exposure and development.

Figure 2E:
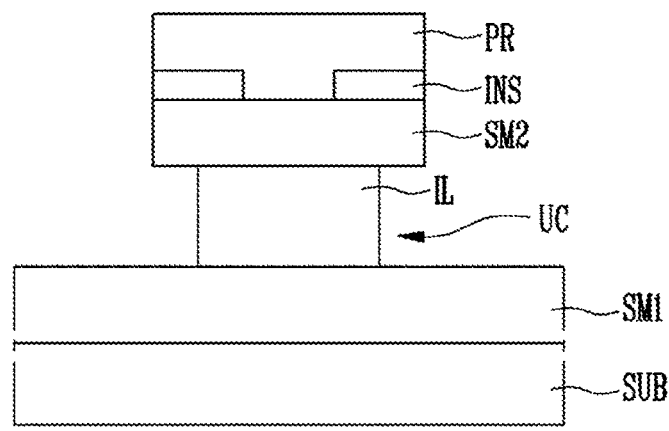

Referring to FIG. 2e, the second semiconductor layer SM2 and the intermediate layer IL are selectively etched with the photoresist layer PR functioning as a mask. Since the second semiconductor layer SM2 and the intermediate layer IL are made of materials having different etching rates, they are etched to different depths during an etching process.

The etching process is not limited to a particular process so long as selective etching is possible. In an embodiment of the present disclosure, the etching process may be performed by any one of a wet etching method, a dry etch method and a combination thereof. For example, the etching process may be performed in such a way that a dry etching operation is performed and, thereafter, a wet etching operation is performed.

In an embodiment of the preset disclosure, the etching rate of the intermediate layer IL is greater than the etching rate of the second semiconductor layer SM2. Therefore, the intermediate layer IL is etched to a depth greater than that of the second semiconductor layer SM2. Thereby, an undercut UC is formed below the second semiconductor layer SM2, that is, in the intermediate layer IL. Because the second semiconductor layer SM2 and the intermediate layer IL have different etching rates, the widths of the second semiconductor layer SM2 and the intermediate layer IL become different from each other after the etching process.

Figure 2F:
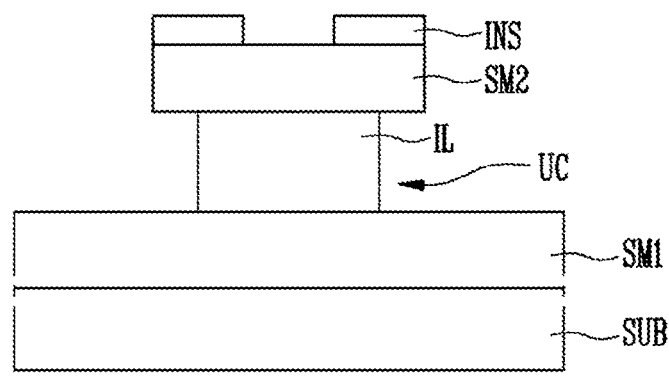

Referring to FIG. 2f, the photoresist layer PR that has been on the insulating layer INS is removed. If the photoresist layer PR is removed, a stack structure in which the intermediate layer IL, the second semiconductor layer SM2 and the insulating layer INS are stacked is formed on the first semiconductor layer SM1.

Figure 2G:
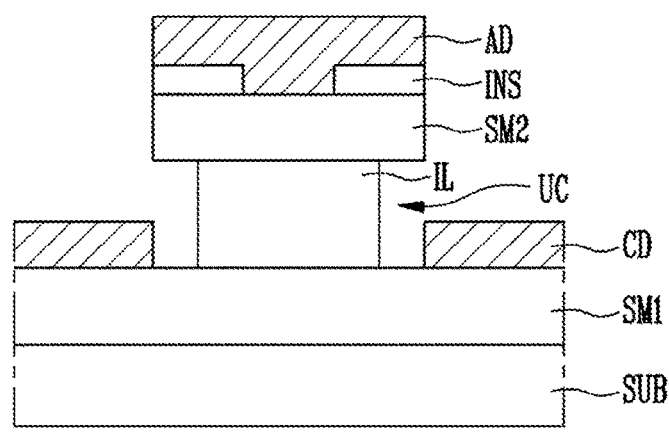

Referring to FIG. 2g, the anode AD and the cathode CD are formed using conductive material.

The anode AD and the cathode CD may be formed at the same time through a single process by, e.g., depositing conductive material on the substrate SUB. When conductive material is deposited on the substrate SUB, the conductive material is deposited both on the stack structure and on a region of the first semiconductor layer SM1 in which the stack structure is not formed. The conductive material formed on the stack structure becomes the anode AD, and the conductive material formed on the region of the first semiconductor layer SM1 in which the stack structure is not formed becomes the cathode CD.

The conductive material may include various metals, alloys of them, etc. In an embodiment of the present disclosure, the metals may include copper, silver, gold, platinum, palladium, nickel, tin, aluminum, cobalt, rhodium, iridium, iron, ruthenium, osmium, manganese, molybdenum, tungsten, niobium, tantalum, titanium, bismuth, antimony, lead, etc. An alloy of at least two metals may be used. The anode AD or the cathode CD may be provided in a single layer, but it is not limited to this. The anode AD or the cathode CD may be provided in multiple layers. For example, the anode AD or the cathode CD may be formed of a combination of layers including Ti/Al/Au or Ti/Al/Ni/Au, or another combination of layers.

With the stack structure, because the width of the second semiconductor layer SM2 disposed over the intermediate layer IL is greater than the width of the intermediate layer IL, conductive material is not deposited on a portion corresponding to a difference in width between the second semiconductor layer SM2 and the intermediate layer IL. That is, conductive material is not formed in a region in which the undercut UC is formed. As a result, the anode AD and the cathode CD are spaced apart from each other by the undercut UC.

As described above, in the Schottky diode in accordance with the embodiment of the present disclosure, the anode and the cathode are formed at the same time through a single process rather than being formed through separate processes. Therefore, the manufacturing process is simplified, and not only the time required for manufacture but also the manufacturing cost is reduced.

The Schottky diode manufactured by the above-mentioned method has impurity doping distribution different from that of the conventional art.

FIG. 3 is a graph conceptually showing the impurity doping concentration of each region in the Schottky diode in accordance with the embodiment of the present disclosure.

Referring to FIG. 3, it is shown that, in the Schottky diode in accordance with the embodiment of the present disclosure, the intermediate layer has a highest impurity concentration. Furthermore, it is shown that the impurity concentration of the first semiconductor layer is lower than that of the intermediate layer but is markedly higher than that of the second semiconductor layer. In particular, in the first semiconductor layer, the closer to the intermediate layer, the higher the impurity concentration is. This is caused by the effect of diffusion of impurities from the intermediate layer into the first semiconductor layer. The second semiconductor layer is not doped with impurities, or although it is doped with impurities, the impurity doping concentration thereof is very low. Furthermore, the diffusion rate of impurities from the intermediate layer into the second semiconductor layer is much lower than that of the first semiconductor layer. As a result, the impurity doping concentration of the second semiconductor layer is very low.

As described above, because the first semiconductor layer has a high impurity doping concentration, ohmic contact resistance between the first semiconductor layer and the cathode is reduced. The reduction in the ohmic contact resistance leads to an additional reduction in series resistance of the entire Schottky diode, thus enhancing the characteristics of the Schottky diode.

Such a Schottky diode may be applied to various elements rather than being limited to an element of a particular field. In an embodiment of the present disclosure, the Schottky diode may be used as an electromagnetic wave sensor. In particular, the Schottky diode in accordance with an embodiment of the present disclosure may be used as a THz electromagnetic wave sensor. With regard to the THz electromagnetic wave sensor based on the Schottky diode, the operating speed thereof basically depends on the RC effect. To operate the sensor based on the Schottky diode in a THz region, an RC time constant must be very low. Accordingly, whether the resistance is reduced is a critical factor in the electromagnetic wave sensor based on the Schottky diode. With regard to the electromagnetic wave sensor, if R is reduced, performance characteristics of the electromagnetic wave sensor based on the Schottky diode in the THz region are enhanced.

In an embodiment of the present disclosure, the electromagnetic wave sensor may further include an antenna coupled to the Schottky diode. In many cases, electromagnetic signals in the THz region are transmitted through the air. Given this, the electromagnetic wave sensor may further include the antenna to detect electromagnetic signals, which are transmitted through the air. Furthermore, in an embodiment of the present disclosure, the electromagnetic wave sensor may further include a lens for focusing electromagnetic waves in the THz region, as well as including the antenna. The lens may be added to an appropriate position of the electromagnetic wave sensor during a process of packing the electromagnetic wave sensor.

A Schottky diode in accordance with an embodiment of the present disclosure is reduced in series resistance. When the Schottky diode is manufactured as an electromagnetic wave sensor, the effect of an increase in speed is obtained.

In a Schottky diode in accordance with an embodiment of the present disclosure, a cathode and an anode may be formed through a single process, whereby the manufacturing process is simplified, and the manufacturing time and cost are reduced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A Schottky diode comprising:
a first semiconductor layer;
an intermediate layer provided over the first semiconductor layer;
a second semiconductor layer provided over the intermediate layer
an insulating layer provided on the second semiconductor layer;
an anode provided over the second semiconductor layer, the anode coming into direct contact with the second semiconductor layer through an opening in the insulating layer; and
a cathode provided over the first semiconductor layer,
wherein in a sectional view, a width of the second semiconductor layer is greater than a width of the intermediate layer.

2. The Schottky diode according to claim 1, wherein a width of the anode is greater than the width of the intermediate layer.

3. The Schottky diode according to claim 1, wherein each of the first semiconductor layer and the intermediate layer include a semiconductor material doped with an impurity.

4. The Schottky diode according to claim 3, wherein the closer to the intermediate layer, the higher an impurity concentration of the first semiconductor layer is.

5. The Schottky diode according to claim 4, wherein an impurity concentration of the second semiconductor layer is lower than the impurity concentration of the first semiconductor layer or an impurity concentration of the intermediate layer.

6. The Schottky diode according to claim 1, wherein the second semiconductor layer includes at least one of indium gallium arsenide (InGaAs) and gallium arsenide (GaAs).

7. The Schottky diode according to claim 6, wherein the intermediate layer includes at least one of indium phosphide (InP), InGaAsP, indium aluminum arsenide (InAlAs), and aluminum gallium arsenide (AlGaAs).

8. The Schottky diode according to claim 1, wherein the intermediate layer and the second semiconductor layer respectively include materials having different etching rates.

* * * * *